(12) United States Patent
Bonin et al.

(10) Patent No.: US 7,898,266 B2
(45) Date of Patent: Mar. 1, 2011

(54) PROBE WITH ELECTROSTATIC ACTUATION AND CAPACITIVE SENSOR

(75) Inventors: Wayne Allen Bonin, North Oaks, MN (US); Dadi Setiadi, Edina, MN (US); Lance Eugene Stover, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 324 days.

(21) Appl. No.: 12/132,665

(22) Filed: Jun. 4, 2008

(65) Prior Publication Data
US 2009/0302869 A1 Dec. 10, 2009

(51) Int. Cl.
G01R 27/26 (2006.01)
G01B 5/28 (2006.01)
(52) U.S. Cl. .................. 324/662; 324/755.07; 73/105
(58) Field of Classification Search .................. 324/663, 324/762; 73/105
See application file for complete search history.

(56) References Cited

U.S. PATENT DOCUMENTS

| | | | |
|---|---|---|---|
| 4,694,687 A | 9/1987 | Bonin | |
| 5,187,367 A | 2/1993 | Miyazaki | |
| 5,396,066 A | 3/1995 | Ikeda | |
| 5,553,486 A | 9/1996 | Bonin | |
| 5,576,483 A | 11/1996 | Bonin | |
| 6,960,945 B1 | 11/2005 | Bonin | |
| 7,000,459 B2 | 2/2006 | Riddering | |
| 7,142,500 B2 | 11/2006 | Fasen | |
| 7,167,434 B2 | 1/2007 | Champion | |
| 7,263,896 B2 | 9/2007 | Bonin | |
| 7,265,937 B1 | 9/2007 | Erden | |
| 2004/0020279 A1 | 2/2004 | Degertekin | |
| 2005/0259503 A1 | 11/2005 | Hilton | |
| 2006/0023606 A1 | 2/2006 | Lutwyche | |
| 2008/0089211 A1 | 4/2008 | Chu | |
| 2008/0209988 A1* | 9/2008 | Degertekin | 73/105 |

FOREIGN PATENT DOCUMENTS
EP 0 471 511 7/1997

OTHER PUBLICATIONS
U.S. Appl. No. 11/933,729, filed Nov. 1, 2007, Inventor: Lee.

* cited by examiner

*Primary Examiner* — Vincent Q Nguyen
(74) *Attorney, Agent, or Firm* — Campbell Nelson Whipps, LLC

(57) ABSTRACT

A supported probe device that has a probe tip and probe body, the probe body having a sample facing surface and an opposing surface. The probe tip and a first electrode are on the sample facing surface. A second electrode is present on the probe body opposing surface. A third electrode is spaced from the second electrode, so that the second electrode is between the third electrode and the probe body. A first DC voltage source is electrically coupled to the first electrode, as is a first sensing circuit. A second DC voltage source is electrically coupled to the second electrode, and an AC voltage source electrically coupled to the third electrode. The probe body may be cantilevered.

10 Claims, 2 Drawing Sheets

PROBE WITH ELECTROSTATIC ACTUATION AND CAPACITIVE SENSOR

BACKGROUND

In computing systems, such as desktop computers, portable or laptop computers, servers, and others, storage devices are used to store data and program instructions. A disk-based storage device is one type of storage device; disk-based storage device include magnetic disk drives (e.g., a floppy disk drive or hard disk drive) and optical disk drives (e.g., a CD or DVD drive). Disk-based storage devices have a relatively large storage capacity. However, disk-based storage devices offer slower read-write speeds when compared to operating speeds of other components of a computing system, such as microprocessors and other semiconductor devices. A solid state memory device is another type of storage device; solid state memory devices include dynamic random access memory (DRAM), static random access memory (SRAM), flash memory, and electrically erasable and programmable read-only memory (EEPROM). Although solid state memory devices offer relatively high read-write speeds, usually on the order of nanoseconds, they have relatively limited storage capacities.

With improvements in nanotechnology, other types of storage devices are being developed. One such storage device is based on atomic force microscopy (AFM), in which one or more microscopic scanning probes are used to read and write to a storage medium. Storage of data in the storage medium is based on perturbations (dents) created by a tip of the probe in the surface of the storage medium. In one implementation, a dent represents a data bit "1," and the lack of a dent represents a data bit "0." Other types of perturbations in the storage medium surface that can be used to convey data include creating or altering the topographic features or composition of the storage medium, altering the crystalline phase of the medium, filling or emptying existing electronic states of the medium, creating or altering domain structures or polarization states in the medium, creating or altering chemical bonds in the medium, employing tunneling effects to move and/or remove atoms or charge to or from the medium, or storing/removing charge from a particular region.

When the probe tip encounters and enters a dent, the tip (usually about 400° C.) transfers heat to the storage medium, which causes the temperature of the probe tip to fall, which in turn causes the electrical resistance of the tip to decrease. This decrease in resistance, which is a relatively tiny amount, is measured by detection circuitry that determines the state of the data bit. Another technique for detecting the state of a data bit uses a piezoresistive element in the probe. When the probe tip encounters a dent, the cantilever of the probe deflects, which causes the resistance of the piezoresistive element to change. This change in resistance is measured by detection circuitry.

However, reliable detection of data bits may not always be possible by the above techniques due to the relatively small change in resistance and the presence of noise and other factors.

To minimize friction and wear, it is desired to operate a probe with the minimum contact force required for proper operation. Due to manufacturing variations in the probe and other assembly tolerances creating variation in the amount of preloaded deflection in the probe, the nominal contact force may be significantly greater than the minimum required value.

Preventing the probe tip from catastrophically contacting the sample or media, e.g., in the case of a shock event, is important. A shock event not only has the potential to damage the local media and the corresponding data, but also to damage the tip itself, leading to the loss of data for the entire media area served by that tip.

BRIEF SUMMARY

The present disclosure relates to probe-structures that utilize a plurality of electrodes to accomplish multiple actions on a probe. The arrangement of these electrodes can be used to actuate the probe, measure displacement or position of the probe tip, and increase or decrease the contact force of the probe tip to calibrate the probe.

One particular embodiment of this disclosure is to a supported probe-structure device having a supported probe with a probe tip and probe body, the probe body having a sample facing surface on a first side and an opposing surface on a second side opposite the first side, with the probe tip on the sample facing surface. A first electrode is on the probe body and a second electrode is fixed with respect to a sample. A first voltage source is electrically coupled to the first and second electrodes to generate a voltage difference between the electrodes, and a first sensing circuit is electrically coupled to those electrodes. The voltage source enables control of the contact force between the probe tip and the sample, and the sensing circuit enables measurement of a position of the probe body with respect to the sample.

Another particular embodiment is a method for determining a position of a probe tip, the method including providing a supported probe a home position for the probe tip, the probe having a probe tip and probe body, the probe body having a sample facing surface and an opposing surface, with the probe tip on the sample facing surface. The probe also has a first electrode on the probe body sample facing surface, a second electrode on the probe body opposing surface, and a third electrode spaced from the second electrode, the second electrode being between the third electrode and the probe body. The method includes determining a capacitance between the second electrode and the third electrode by measuring a voltage across the second electrode and the third electrode, and then correlating the capacitance to a displacement distance from the home position of the probe tip.

Yet another particular embodiment is a method for calibrating a probe, the method including providing a supported probe having a neutral position in contact with a sample, with the probe having a probe tip and probe body, the probe body having a sample facing surface and an opposing surface, with the probe tip on the sample facing surface. The probe also has a first electrode on the probe body sample facing surface, a second electrode on the probe body opposing surface, and a third electrode spaced from the second electrode, the second electrode being between the third electrode and the probe body. The method further includes applying a DC voltage to the second or the third electrode to obtain an attractive force therebetween until the probe tip moves from its neutral position, recording the voltage needed to move the probe tip from its neutral position, and then correlating the voltage needed to move the probe tip from its neutral position to a force needed to move the probe tip from its neutral position.

BRIEF DESCRIPTION OF THE DRAWINGS

The invention may be more completely understood in consideration of the following detailed description of various embodiments of the invention in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present invention. The following detailed description, therefore, is not to be taken in a limiting sense.

Several probe-based instruments monitor the interaction between a probe and a sample to obtain information concerning one or more characteristics of the sample. The present disclosure relates to a probe structures for obtaining information about one or more characteristics of a sample material. The probe structure has a plurality of electrodes in close proximity to the probe. Present on the probe is a first set of electrodes, one electrode on the probe tip side and one electrode on the opposing side of the probe body. Spaced from the electrode on the opposing side of the probe body is at least one additional electrode. These electrodes can be used to actuate the probe, measure displacement or position of the probe, and increase or decrease the contact force of the probe (e.g., calibrate the probe to adjust for variations due to manufacturing tolerance variations).

One particular embodiment of this disclosure is a supported probe-structure device having a first electrode on the probe body and a second electrode is fixed with respect to a sample. A first voltage source is electrically coupled to the first and second electrodes to generate a voltage difference between the electrodes, and a first sensing circuit is electrically coupled to those electrodes. The voltage source enables control of the contact force between the probe tip and the sample, and the sensing circuit enables measurement of a position of the probe body with respect to the sample.

Another particular embodiment of this disclosure is a supported probe-structure device that has a probe tip and probe body with the probe tip and a first electrode on the same surface. A first DC voltage source is electrically coupled to the first electrode, as is a first sensing circuit. A second electrode is present on the probe body opposing surface. A third electrode is spaced from the second electrode, so that the second electrode is between the third electrode and the probe body. A second DC voltage source is electrically coupled to the second electrode, and a second sensing circuit is electrically coupled to the third electrode.

While the present invention is not so limited, an appreciation of various aspects of the invention will be gained through the discussion provided below.

Figure 1:
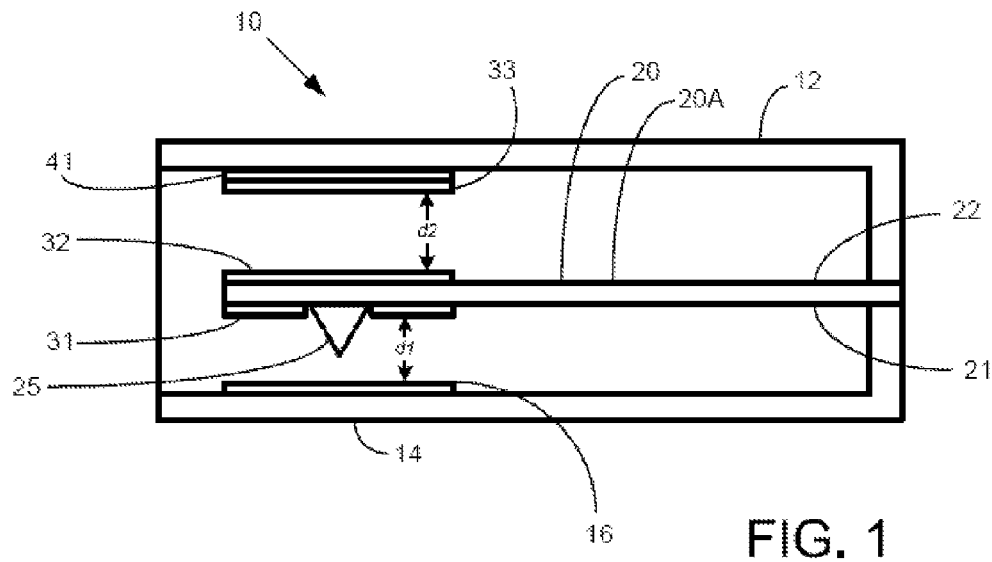
FIG. 1 is a schematic side view of a cantilever-based probe structure in accordance with this disclosure, in particular, a probe based memory device.

Referring to FIG. 1, a first embodiment of a probe structure according to the present disclosure is schematically illustrated as cantilevered probe-based memory device 10. It is noted that although the example provided is a cantilevered probe, the inventive concepts of this disclosure can be used with other suspended probe configurations and are not limited to cantilevered probes. For example, the concepts could be used with a cross-beam probe. Some examples of a supported cross-beam probe which could benefit from the concepts herein are described in Applicant's co-pending patent application 12/119,717 filed May 13, 2008.

In this embodiment, memory device 10 has an enclosure 12 housing a storage substrate 14 including a storage medium 16. Storage medium 16 can be any medium in which storage cells are capable of being formed. Storage medium 16 can make up a portion of storage substrate 14, or storage medium 16 can be considered to be the whole storage substrate 14. Storage medium 16 may be composed of a single material or multiple materials, for example, multiple layers. The configuration of storage medium 16 and storage substrate 14 may be any suitable configuration, as it does not affect the invention of this disclosure. In some embodiments, storage medium 16 is conductive and is electrically connected to electrical ground (i.e., medium 16 is grounded). In other embodiments, medium 16 is an insulator or dielectric material.

The invention of this disclosure is the probe within the device and the system to control and determine the position of the probe. Memory device 10 includes at least one probe 20 to interact (e.g., read/write) with storage medium 16. According to some embodiments, probe 20 is a very small probe (on the order of micrometers, nanometers, or even smaller) that is built using nanotechnology techniques (e.g., thin film or micro-electro-mechanical system (MEMS) techniques). In most embodiments, memory device 10 has multiple probes 20; in some embodiments, hundreds to thousands of probes 20 are present in memory device 10.

Figure 2:
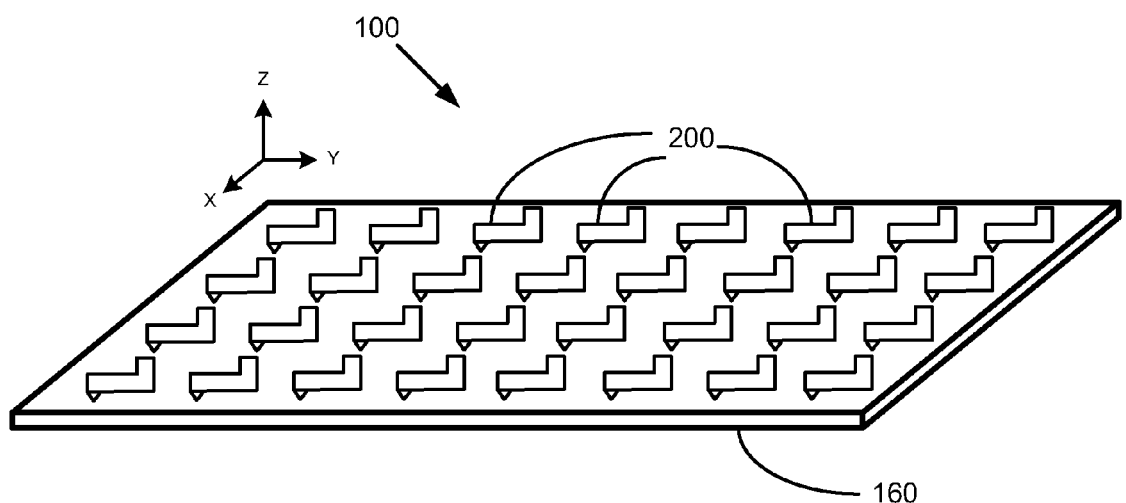
FIG. 2 is a schematic perspective view of a probe based memory device having a plurality of probes in accordance with this disclosure.

FIG. 2 illustrates a portion of a memory device 100 having a plurality of probes 200 orderly arranged over a storage medium 160. In this embodiment, a 4 by 8 array of probes is shown. The array of probes 200 and storage medium 160 are each planar and extend generally parallel with each other along an X-Y plane. At least one of, and preferably each of, probes 200 is a probe (e.g., probe 20) according to this disclosure. Probes 200 and medium 160 are moveable along the X-Y plane in respect to each other; that is, either probes 200 or medium 160 move laterally and longitudinally to increase the potential contact area of each probe 200 to medium 160. In many embodiments, each probe 200 is configured to contact about 100-250 μm linear length of medium 160 (about 10,000-62,500 μm$^2$). Each probe 200 is additionally configured to move orthogonal in relation to medium 160, in the Z direction. Usually in a device such as memory device 100, only a small portion of probes 200, e.g., 10% of probes 200, contact medium 160 at one time. Those probes 200 not in contact with medium 160 are raised (in the Z direction) so that undesired contact between an unused probe and medium 160 does not occur.

Returning to FIG. 1, probe 20 is a cantilevered structure out from, for example, a side wall of enclosure 12. In other embodiments, probe 20 is cantilevered from a top wall or surface of enclosure 12, a bottom wall or surface, or other support structure. For embodiments where probe 20 is supported by a bottom surface of enclosure 12, storage medium 16 would typically be on the opposite top surface of the enclosure, however, in some embodiments, probe 20 may be supported on a surface that also support medium 16. In FIG.

2, probes 200 are oriented as extending down from a not-shown top surface of, e.g., an enclosure.

Probe 20 has a body 20A having a first surface 21 and an opposing second surface 22. In this illustration, first surface 21 is a media facing surface, oriented toward storage medium 16. Probe body 20A is shaped and made of a material to allow body 20A to flex in the vertical direction (orthogonal to storage medium 16), towards and away from storage medium 16.

A probe tip 25 is positioned on media facing surface 21, in this embodiment, close to the end of the cantilevered body 20A. Probe tip 25 is illustrated schematically as a triangular structure, although other configurations may be used. Probe tip 25 is configured to operably engage storage medium 16 and detect information, such as, for example, indents in medium 16, electrically conductive or magnetic bumps on medium 16, a resistance or voltage distribution on medium 16, or a magnetic charge on medium 16. In some embodiments, probe tip 25 is configured to form indents or perturbations in medium 16. Probe tip 25 may be mechanically hard (to resist wear), to be chemically compatible with medium 16 (to avoid medium or electrode degradation), and to have high electrical conductivity in both its bulk and/or surface. Medium 16 will affect the configuration and features of probe tip 25.

Probe 20 includes various electrodes, described below. With connected voltage sources, these electrodes can be used to apply a force to probe body 20A to move or displace probe tip 25 as desired. With connected capacitance measuring devices, these electrodes can be used to determine the position of probe tip 25.

Present on probe 20, e.g., on probe body 20A, are electrodes. A first electrode 31 is positioned on medium facing surface 21 proximate probe tip 25. Electrode 31 is spaced a distance "d1" from medium 16. In most embodiments, no interfering structural element is present in the gap between electrode 31 and medium 16. In the illustrated embodiment, first electrode 31 is composed of two electrode portions, one on each side of probe tip 25, although other configurations of an electrode on medium facing surface 21 are acceptable. For example, electrode 31 may be an annular electrode with probe tip 25 centrally positioned.

Also present on probe body 20A is a second electrode 32 positioned opposite first electrode 31 on opposing surface 22. Generally, electrode 32 is parallel to and aligned with electrode 31. It is not necessary that electrodes 31, 32 have the same surface area or the same general dimensions. In the illustrated embodiments, electrodes 31, 32 extend from the free end of body 20A toward the supported end generally the same distance.

Positioned in close proximity to second electrode 32 yet spaced from and not present on probe body 20A is at least one additional electrode, in this embodiment, a third electrode 33. Electrode 33 is supported by enclosure 12; an insulator layer 41 is present between electrode 33 and enclosure 12.

Electrode 33 is vertically displaced in relation to probe 20, and specifically, in relation to second electrode 32 present on probe body 20A. At least a portion of third electrode 33 overlaps second electrode 32. In the illustrated embodiment, electrodes 32, 33 are aligned and have the same general dimensions. Second electrode 32 on probe 20 and third electrode 33 on enclosure 12 are separated by a distance "d2", with preferably no interfering structural element between electrode 32 and electrode 33. Electrode 32 and electrode 33 extend generally parallel to each other.

Figure 1A:
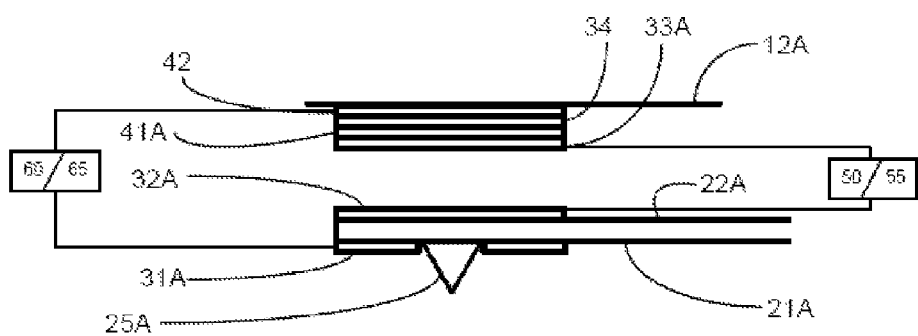
FIG. 1A is a schematic side view of a portion of an alternate embodiment of the cantilever-based probe structure of FIG. 1.

An alternate embodiment of a suspended probe structure is illustrated in FIG. 1A. This embodiment includes a probe body having a first, media facing surface 21A and an opposing second surface 22A. A probe tip 25A is positioned on media facing surface 21A.

Present on medium facing surface 21A is a first electrode 31A composed of two electrode portions, one on each side of probe tip 25A. Also present on opposing surface 22A is a second electrode 32A.

Positioned in close proximity yet spaced from second electrode 32A is at least one additional electrode, in this embodiment, a third electrode 33A and a fourth electrode 34, which are vertically displaced in relation to second electrode 32A. At least a portion of fourth electrode 34 physically overlaps third electrode 33. In the illustrated embodiment, electrodes 33, 34 are parallel, are aligned and have the same general dimensions. Positioned in alternating manner between electrodes 33A, 34 is a first insulator layer 41A. A second insulator layer 42 is present adjacent electrode 34, providing electrical insulation of electrode 34 from enclosure 12A.

Returning to FIG. 1, a controllable DC voltage source (not illustrated) is electrically connected to first electrode 31 to apply an adjustable bias voltage between probe body 20A and medium 16. A controllable DC voltage source (not illustrated) is also electrically connected to electrode 32. A circuit (not illustrated) for measuring the capacitance between electrode 31 and medium 16 may be included. FIG. 1A shows a first voltage source 50 and a first sensing circuit 55; and a second voltage source 60 and a second sensing circuit 65.

In some embodiments, a controllable DC voltage source (not illustrated) is electrically connected to third electrode 33. Additionally or alternatively, capacitance sensing circuitry (not illustrated) is electrically connected to third electrode 33. Alternatively, the capacitance sensing circuitry may be connected to second electrode 32. For embodiments having fourth electrode 34, the capacitance sensing circuit may be implemented by connecting an AC voltage source to fourth electrode 34 and AC voltage sense circuitry to third electrode 33. When present, fourth electrode 34 can be referred to as a "drive" electrode, and third electrode 33 can be referred to as a "pick-up electrode", picking up voltage from fourth electrode 34, with electrode 32 preferably connected to ground or an adjustable DC potential. By including fourth electrode 34, the parasitic capacitance to ground from electrode 33 is inhibited and in most embodiments, is eliminated.

As used here, the term "AC" covers signals with a varying or alternating voltage, as well as a varying or alternating current, and "DC" covers both current and voltage signals which are generally constant, but may be adjusted and set to different levels as desired, in accordance with accepted modern usage of the term.

Electrodes 31, 32, being positioned on probe body 20A, are movable with respect to medium 16 and to electrodes 33, 34. As indicated above, the arrangement of these electrodes can be used to actuate probe 20, measure displacement or position of probe 20, and increase or decrease the contact force of probe tip 25 (e.g., calibrate probe 20 to adjust for variations due to manufacturing tolerance variations).

To actuate probe 20, e.g., to move probe 20 in contact with medium 16, a DC voltage can be applied to electrode 31 to establish an attractive force between probe tip 25 and medium 16. Because electrode 31 on cantilevered probe body 20A is movable, electrode 31 is drawn to medium 16 and contact between probe tip 25 and medium 16 can be established. In some embodiments, a voltage of 10-20 volts is sufficient to move probe tip 25 about 1-2 micrometers. To move probe 20 out of contact from medium 16, the voltage is removed. In an alternate embodiment, to move probe 20 out of contact from medium 16, a DC voltage differential applied between second electrode 32 and third electrode 33 can establish an attractive force between electrodes 32, 33, thus drawing electrode 32 and probe body 20A toward electrode 33.

The capacitance between two objects can be used to determine the relative position between two objects, e.g., first electrode 31 and medium 16, or second electrode 32 and third electrode 33. The capacitance between the two objects is a function of the area of overlap of the two objects and the distance between the two objects. As the objects move in relation to each other, the change is capacitance is measured as the output voltage between the objects. From the capacitance change or output voltage, the amount of relative displacement between the objects can be determined. For certain devices, medium 16 may be an electrical insulator, in which case substrate 14 may serve as an electrode cooperating with first electrode 31 to allow a capacitance measurement to determine distance d1.

To determine the position of probe 20 or probe tip 25, a home or equilibrium position for probe 20 can be determined by measuring either or both the voltage across electrode 31 to medium 16 or across electrode 32 to electrode 33. As probe 20 is moved, for example, away from medium 16, distance d1 increases and distance d2 decreases. Thus, the capacitance between electrode 32 and electrode 33 increases, measurable by a decrease in the output voltage across electrodes 32, 33 or an increase in the output voltage between electrode 31 and medium 16. Similarly, as probe 20 is moved toward medium 16, distance d1 decreases and d2 increases. Thus, the capacitance between electrode 32 and electrode 33 decreases, measurable by an increase in the output voltage across electrodes 32, 33 or a decrease in output voltage between electrode 31 and medium 16. This change in voltage can be correlated to a displacement distance from the home position.

As the distance between electrodes 32, 33 or electrode 31 and medium 16 approaches 0 (zero), the output voltage therebetween also approaches 0 (zero). Thus, actuation of the probe (i.e., contact between probe tip 25 and medium 16) can be readily realized from the output voltage across electrode 31.

Various electrodes of device 10 may also be used for self-calibration of probe 20. Calibration of probe 20 can be done to adjust for, for example, variations in manufacturing. Examples of manufacturing variations that might affect the probe properties include the characteristics of body 20A (e.g., thickness of body 20A, length of body 20A, the material used, anchoring or support of body 20A), the position of probe tip 25 on medium facing surface 21, and the mass of probe tip 25. Because device 10 and probe 20 is on the order of micrometers, any slight variation will affect the operation of probe 20. Especially for embodiments having a plurality of probes, such as memory device 100 of FIG. 2 which has numerous probes 200, it is beneficial to recognize any differences in performance between individual probes.

Many probes are manufactured to have probe tip 25 in contact with medium 16 when no applied force is present; that is, when in a neutral position, probe tip 25 is in contact with medium 16. By using electrodes 32, 33, the "zero net force" of probe 20 can be determined, the zero net force being the force needed to just start to lift probe tip 25 away from medium 16.

The zero net force point may be determined by gradually increasing the DC voltage between second electrode 32 and third electrode 33, while simultaneously monitoring either or both distance d1 and distance d2 in a manner as previously described. When probe tip 25 is in contact with medium 16, distance d1 and distance d2 remain essentially constant, even as the contact force between tip 25 and medium 16 is reduced from a relatively high initial value to a lower value approaching zero. As the force between electrodes 32 and 33 pulling up on probe 20 exceeds the spring force pushing down, probe tip 25 is pulled away from medium 16, causing distance d1 to increase and distance d2 to decrease. The input voltage (between electrodes 32, 33) needed to lift probe tip 25 is recorded as the zero net force voltage. Probe 20 can then be programmed to include this zero net force when a force is needed to raise probe tip 25 a desired distance.

In the same manner, spring stiffness of probe body 20A or other structure supporting probe tip 25 may be determined by continuing to increase the actuation force past the lift-off point (i.e., the zero net force), and dividing the force difference by the position difference.

Another example of a cantilever-based probe structure used to monitor the interaction between a cantilever-based probe and a sample to obtain information concerning one or more characteristics of the sample is a scanning probe microscope. Scanning probe microscopes (SPMs) typically characterize the surface of a sample down to atomic dimensions by monitoring the interaction between the sample and a probe tip on the cantilever probe. By providing relative scanning movement between the tip and the sample, surface characteristic data can be acquired over a particular region of the sample, and a corresponding map of the sample can be generated.

Figure 3:
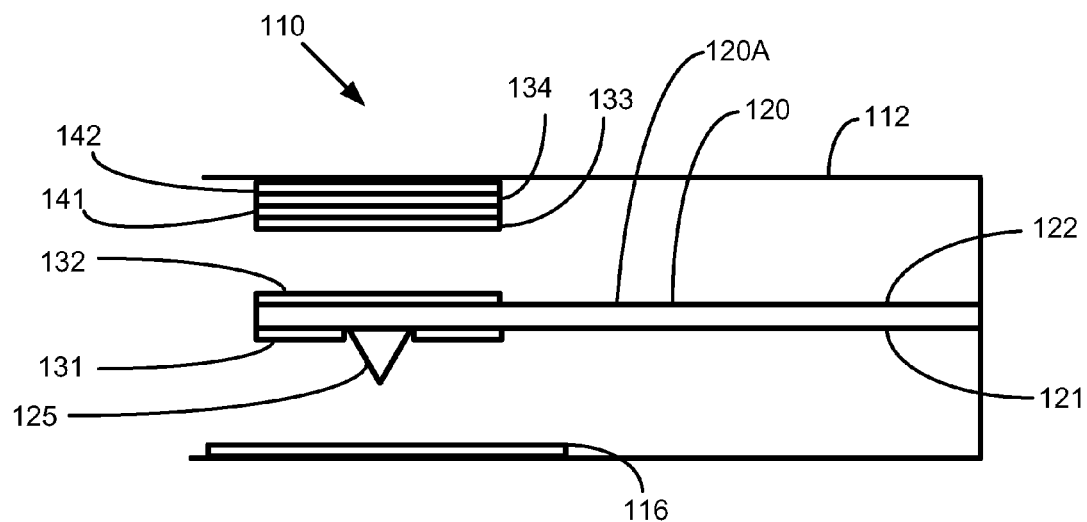
FIG. 3 is a schematic side view of a cantilever-based probe structure in accordance with this disclosure, in particular, a probe microscope.

FIG. 3 shows a second embodiment of a cantilever-based probe structure according to the present disclosure, particularly, a probe-based microscope 110. The various elements of microscope 110 have the same properties and qualities as the respective elements of storage memory 10, unless otherwise indicated.

Microscope 110 has a support structure 112 supporting a sample 116 to be examined. Microscope 110 includes a probe 120 to interact with sample 116. According to some embodiments, probe 120 is a very small probe (on the order of micrometers, nanometers, or even smaller) that is built using nanotechnology techniques (e.g., thin film or MEMS techniques). In some embodiments, microscope 110 has multiple probes 120.

Probe 120 is a cantilevered structure out from, for example, a side wall of support structure 112. In other embodiments, probe 120 is supported from a top wall or surface of structure 112, or other support structure. Probe 120 has a body 120A having a first surface 121 and an opposing second surface 122. In this illustration, first surface 121 is a sample facing surface, oriented toward sample 116. Probe body 120A is shaped and made of a material to allow body 120A to flex in the vertical direction, towards and away from sample 116.

A probe tip 125 is positioned on sample facing surface 121, in this embodiment, close to the end of the cantilevered body 120A. Probe tip 125 is configured to operably engage sample 116 and detect, for example, topographical features on sample 116.

Present on probe 120, e.g., on probe body 120A, are electrodes. A first electrode 131 is positioned on sample facing surface 121 and a second electrode 132 is positioned opposite first electrode 131 on opposing surface 122. Generally, electrode 131 is parallel to and aligned with electrode 132. In the illustrated embodiment, first electrode 131 is composed of two electrode portions, one on each side of probe tip 125; other configurations of an electrode on sample facing surface 121 are acceptable. It is not necessary that electrodes 131, 132 have the same surface area or the same general dimensions.

A DC voltage source (not illustrated) is electrically connected to electrode 131 to apply a bias voltage between probe body 120A and sample 116. A DC voltage source (not illustrated) is also electrically connected to electrode 132. A circuit for measuring an output voltage across electrode 131 and sample 116 is also present but not illustrated.

Positioned in close proximity to second electrode 132 yet spaced from and not present on probe body 210A is at least one additional electrode, a third electrode 133. Electrode 133 is vertically displaced in relation to probe 120, and specifically, in relation to second electrode 132 present on probe body 120A. Electrode 32 and electrode 33 extend generally parallel to each other.

An optional fourth electrode 134 is also present, vertically displaced in relation to probe 120 and proximate to third electrode 133. In the illustrated embodiment, electrodes 133, 134 are parallel, are aligned and have the same general dimensions. Positioned in alternating manner between electrodes 133, 134 is an insulator layer 141. A second insulator layer 142 is present adjacent electrode 134, providing electrical insulation of electrode 134 from enclosure 112.

In some embodiments, a DC voltage source (not illustrated) is electrically connected to third electrode 133. Additionally or alternatively, an AC voltage source (not illustrated) is electrically connected to third electrode 133. For embodiments having fourth electrode 134, an AC voltage source is connected to fourth electrode 134 rather than to electrode 133, and voltage from fourth electrode 134 can pass to third electrode 133. When present, fourth electrode 134 can be referred to as a "drive" electrode, and third electrode 133 can be referred to as a "pick-up electrode", picking up voltage from fourth electrode 134. A circuit for measuring an output voltage across electrode 132 to electrode 133 is also present but not illustrated.

Electrodes 131, 132 positioned on probe body 120A are movable with respect to sample 116 and to electrodes 133, 134. As discussed above in respect to memory device 10, the arrangement of these electrodes can be used to actuate probe 120, measure displacement or position of probe 120, and increase or decrease the contact force of probe tip 125 (e.g., calibrate probe 120 to adjust for variations due to manufacturing tolerance variations).

Thus, embodiments of the PROBE WITH ELECTROSTATIC ACTUATION AND CAPACITIVE SENSOR are disclosed. The implementations described above and other implementations are within the scope of the following claims. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A probe-structure device in relation to a sample, the probe-structure device comprising:
 a supported probe having a probe tip and probe body, said probe body having a sample facing surface on a first side and an opposing surface on a second side opposite said first side, with said probe tip on said sample facing surface;
 a first electrode positioned on said sample facing surface of said probe body;
 a second electrode positioned on said opposing surface of said probe body;
 a third electrode fixed with respect to the sample;
 a fourth electrode spaced from said third electrode, said fourth electrode fixed with respect to the sample;
 a first voltage source electrically coupled to said second and third electrodes to generate a voltage difference between said electrodes;
 a second voltage source electrically coupled to said first and fourth electrodes to generate a voltage difference between said electrodes;
 a first sensing circuit electrically coupled to said second and third electrodes;
 wherein said voltage sources enable control of contact force between said probe tip and the sample, and wherein said sensing circuit enables measurement of a position of said probe body with respect to the sample.

2. The device of claim 1, wherein said probe-structure device is a probe microscope.

3. A probe-structure device in relation to a sample, the probe-structure device comprising:
 a supported probe having a probe tip and probe body, said probe body having a sample facing surface on a first side and an opposing surface on a second side opposite said first side, with said probe tip on said sample facing surface;
 a second electrode positioned on said opposing surface of probe body;
 a third electrode fixed with respect to the sample and spaced apart from and facing said second electrode;
 a fourth electrode spaced apart from and in face to face proximity with said third electrode, such that said third electrode is located between aid second electrode and said fourth electrode;
 a first voltage source electrically coupled to said second and third electrodes to generate a voltage difference between said electrodes; and
 a first sensing circuit electrically coupled to said second and third electrodes;
 wherein said voltage source enables control of contact force between said probe tip and the sample, and wherein said sensing circuit enables measurement of a position of said probe body with respect to the sample.

4. The device of claim 3 further comprising an insulating layer between said third electrode and said fourth electrode.

5. The device of claim 4 wherein said sensing circuit includes an AC voltage signal coupled to said fourth electrode and a voltage sensing circuitry coupled to said third electrode.

6. The device of claim 3 further comprising a first electrode located on said sample facing surface of said probe body.

7. The device of claim 6, wherein the probe structure moves electrostatically toward the sample upon application of a DC voltage to said first electrode.

8. The device of claim 6, wherein said probe-structure device is a probe microscope.

9. The device of claim 3, wherein the probe structure moves electrostatically away from the sample upon application of a DC voltage between said second electrode and said third electrode.

10. The device of claim 3, wherein said probe-structure device is a probe microscope.

* * * * *